United States Patent [19]

Slutsker et al.

[11] Patent Number: 5,708,590
[45] Date of Patent: Jan. 13, 1998

[54] METHOD AND APPARATUS FOR REAL TIME RECURSIVE PARAMETER ENERGY MANAGEMENT SYSTEM

[75] Inventors: Ilya Slutsker; Sasan Mokhtari, both of Plymouth, Minn.; Kevin Clements, Westborough, Mass.

[73] Assignee: Siemens Energy & Automation, Inc., Alpharetta, Ga.

[21] Appl. No.: 761,033

[22] Filed: Dec. 5, 1996

Related U.S. Application Data

[63] Continuation of Ser. No. 423,609, Apr. 17, 1995, Pat. No. 5,627,760.
[51] Int. Cl.$^6$ ............................................. H02J 1/10
[52] U.S. Cl. .................. 364/492; 364/495; 364/550; 307/59; 307/62
[58] Field of Search .......................... 364/492, 481, 364/483, 495, 572, 578, 550; 307/59, 62, 38, 39, 40, 41

[56] References Cited

U.S. PATENT DOCUMENTS

| | | | |
|---|---|---|---|
| 4,812,995 | 3/1989 | Girgis et al. | 364/481 |
| 4,847,781 | 7/1989 | Brown, III et al. | 364/492 |
| 5,442,335 | 8/1995 | Cantin et al. | 340/825.71 |
| 5,465,321 | 11/1995 | Smyth | 395/22 |
| 5,627,760 | 5/1997 | Slutsker et al. | 364/492 |

*Primary Examiner*—James P. Trammell
*Assistant Examiner*—Demetra R. Smith

[57] ABSTRACT

A new method and apparatus for recursive parameter estimation which closely approximates actual values is taught. Briefly stated, the within invention estimates impedance parameters of network branches in both on-line and off-line modes, providing accurate estimation of branch parameters in the presence of noise in measurements and rejecting gross measurement errors, by use of a Kalman type Markov filter scheme using maximum likelihood estimation.

5 Claims, 3 Drawing Sheets

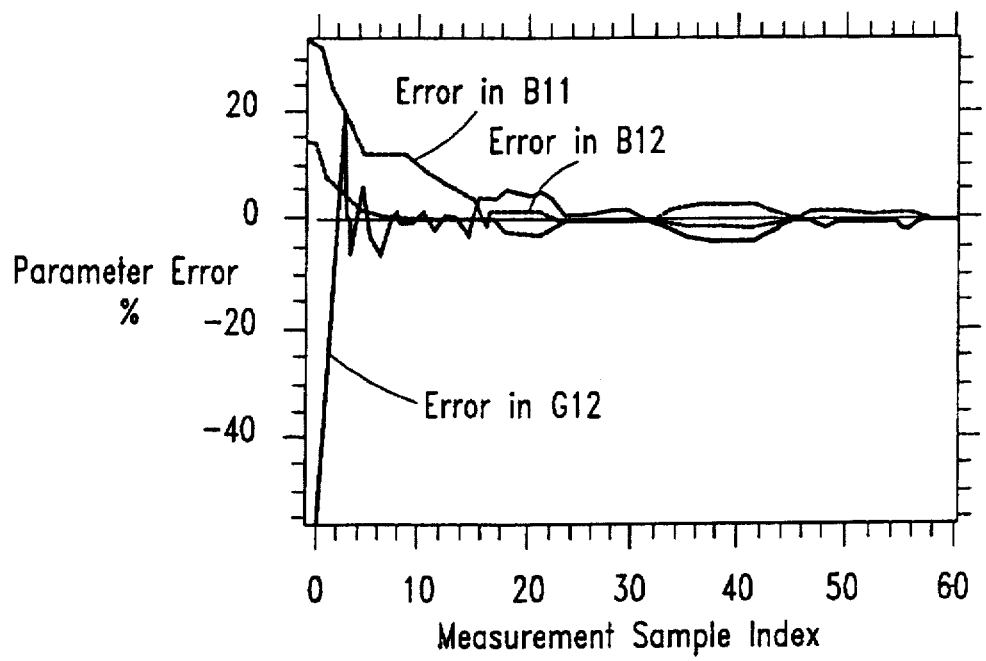
FIG. 2 Convergence characteristics of parameter estimation
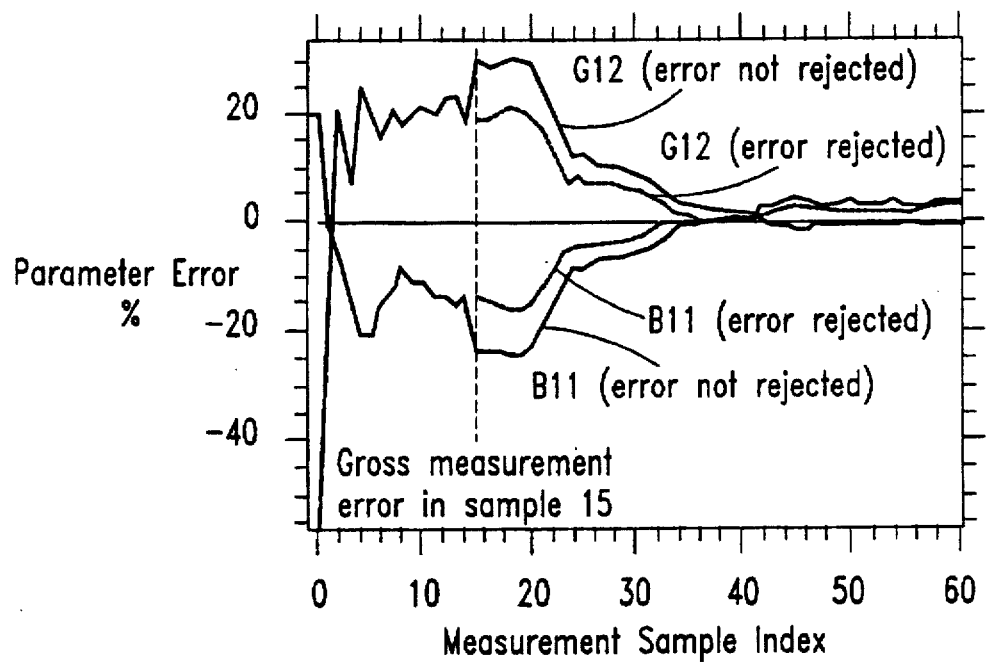
FIG. 3 Effect of gross measurement error rejection on accuracy of parameter estimation.

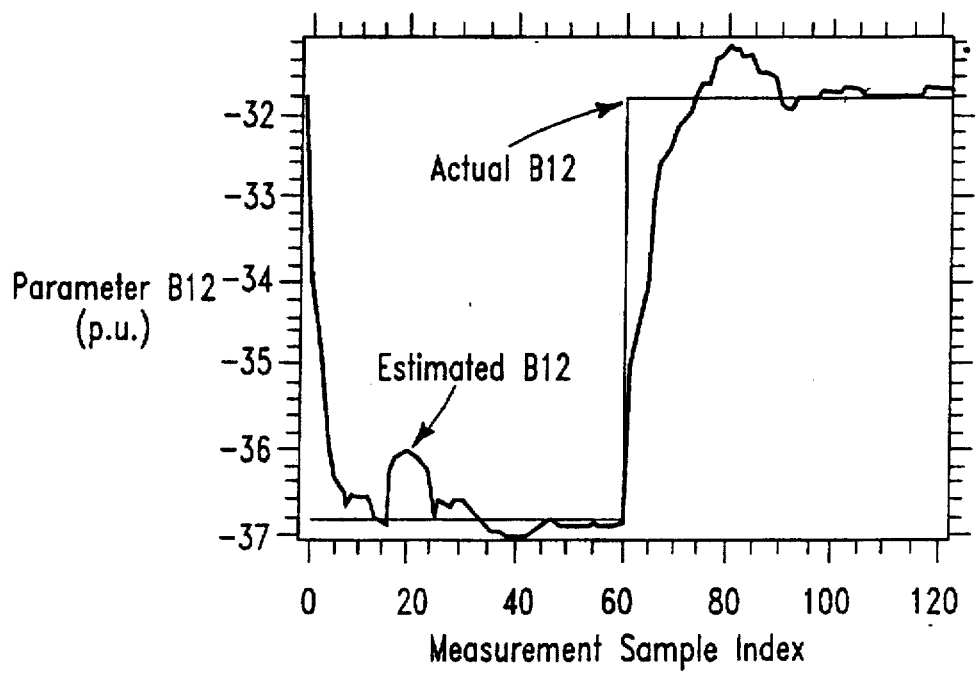
FIG. 4  Branch susceptance tracking in on-line parameter estimation.
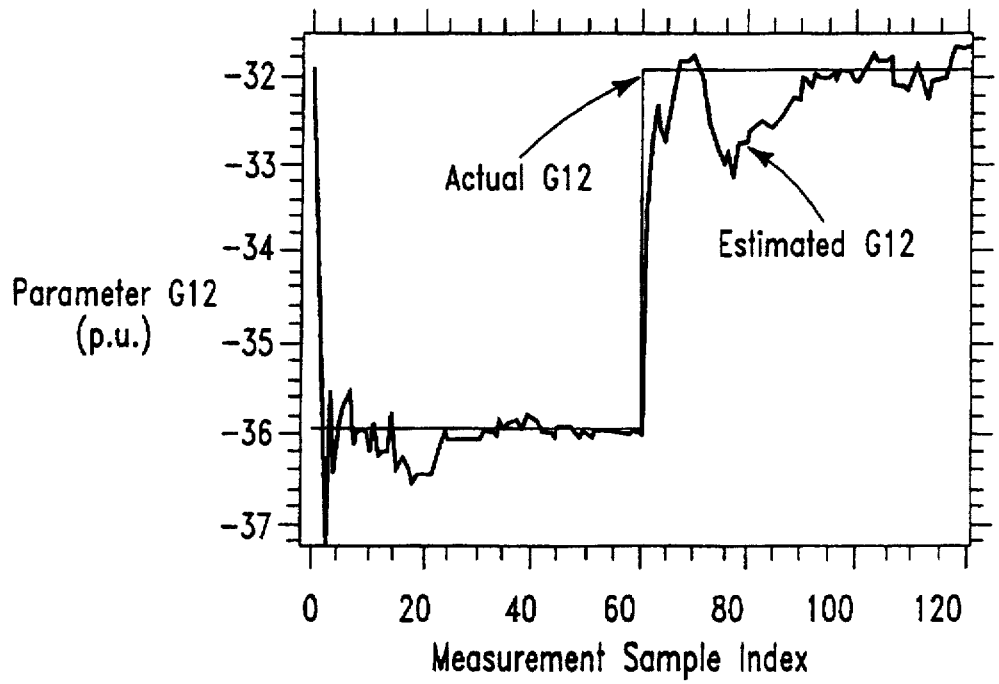
FIG. 5  Branch conductance tracking in on-line parameter estimation.

METHOD AND APPARATUS FOR REAL TIME RECURSIVE PARAMETER ENERGY MANAGEMENT SYSTEM

This is a continuation of application Ser. No. 08/423,609 filed Apr. 17, 1995 now U.S. Pat. No. 5,627,760.

FIELD OF THE INVENTION

This invention relates, generally, to Energy Management in grid wide or branch parameters for large scale power distribution systems, and more particularly to a method and apparatus for a recursive parameter energy management system which correctly estimates various parameters, particularly impedance for an on-line or off-line power management system.

BACKGROUND OF THE INVENTION

Power system state estimation is a critical function in energy control centers. It is necessary to know the state of a given network, grid or the like in order to calculate or project a number of factors, including but not limited to load, load shedding, efficiency, power distribution, and fault prediction. State estimators require two kinds of information, measurement data which is accumulated (telemetered) and the electrical network model. Both measurement and model data are required to construct an accurate picture of the state of the system.

Accordingly, errors in either the telemetered data or the network model can seriously degrade the performance of a state estimator. Such errors have a non-linear effect on the correctness of state estimation values, such errors in even a modest 100 bus network, for example, can produce errors ranging from a nominal amount to forty percent. Therefore, depending on the size or number of busses, parameter errors can have similar or more adverse impact on state estimation than actual measurement errors.

Moreover, it has been found that undetected errors in branch parameters may severely affect the accuracy of network optimization as well as security applications, thereby reducing their effectiveness and, in some circumstances, leading to harmful control actions. Such actions may include, for example, altering the settings on tap changers, power factor correction, load shedding and the like.

Further, due to the recent efforts to deregulate the utility industry, estimation of branch impedance parameters is gaining more attention in power system analysis. Therefore, a key component of comprehensive estimation in energy management systems along with state and topology estimation is accurate impedance estimation.

Over time, there have been a number of investigators which have studied the problem of parameter estimation. These investigations have resulted in three basically different approaches being used. One such approach is that of the estimation of network parameters using a single data scan (one time point) of measurement data. However, this is impractical and prone to errors since there are rarely enough measurements in the vicinity of uncertain parameters to enable their estimation with just a single scan of measurements.

A second approach has been tried in which a set of measurements at multiple time points is used. A batch processing system algorithm is then used to solve for parameter estimates. However, this second approach is problematic since batch processing algorithms are well suited for off-line studies but are not amenable to on-line applications.

A third approach is to use a recursive algorithm based on the use of a Kalman filter. This approach models the bus voltage and angle variables as Markov processes and the network parameters as constants. This third approach is better for on-line estimations since the use of dynamic models allows one to use a recursive estimation in which apriori information about the state and parameter estimates is combined with current measurement data in order to update the parameter estimates.

Unfortunately, computational experience has indicated that the problem, as formulated by this third approach has the potential for convergence problems when it is applied to problems with large networks and/or several uncertain parameters. Moreover, the third approach treats network parameters as constants. This is simply not an acceptable tradeoff in an on-line system. More particularly, system parameters change for a number of reasons such as component aging over time, weather, environment and the like. Therefore, this limits the flexibility of the approach since some network parameters, such as corona losses, are time varying.

More recently, it has been proposed to use parameter estimation based on the analysis of state estimator measurement residuals. In this approach the state estimation and parameter estimation problems are solved separately. However, this approach is based on a single scan of measurements and therefore suffers from observability problems.

Accordingly, it is an object of the present invention to produce an energy management system which allows for estimation of all branch impedance parameters, i.e. transfer susceptance, transfer conductance, charging and corona losses.

It is another object of the present invention to produce an energy management system which it supports all main branch models; balanced Pi without corona losses, unbalanced Pi without corona losses, balanced Pi with corona losses, LTC and phase shifting transformer models.

Still a further object of the present invention is to produce an energy management system which allows for accurate tracking of branch parameters that continuously change due to changes in loading and ambient conditions, such as resistance, corona losses, charging and tap position parameters.

Yet another object of the present invention is to produce an energy management system which solution is not affected by changes in network and measurement topology, while unrestricted topology changes in measurement samples are permitted.

It is another object of the present invention to produce an energy management system which can be used in both an off-line and an on-line environment.

It is still another object of the present invention to produce an energy management system which has no dependencies on results of state estimation or other network applications and can be implemented in a Supervisory Control And Sata Acquisition (SCADA) environment.

A further object of the present invention is to produce an energy management system which supports tap estimation and facilitates estimation of impedance curves for LTC and phase shifting transformers.

It is another object of the present invention to produce an energy management system which in an on-line environment, estimated branch parameters can be automatically fed back into the data base for use in other optimization and security network applications.

A still further object of the present invention to produce an energy management system which provides fast execution by solving several small problems rather than one large problem with much lower overall matrix fill-in.

Yet another object of the present invention is to produce an energy management system which does not presume that some branches have accurate parameters that can be used as known quantities for estimation of other branches.

Still a further object of the present invention is to produce an energy management system which supports adaptive expansion of coverage areas where branches with high measurement redundancy are estimated first until their parameters are established, followed by branches with low redundancy.

Finally, it is another object of the present invention to produce an energy management system and method for recursive parameter energy management control, comprising measurement means for measuring the status and settings of a power grid or subsystem (grid) and producing representative grid data thereof, a computer having memory means for storing said grid data and program means for analyzing said grid data and producing values representative of the impedance parameters of said grid, said program means including means for separating said grid data into a plurality of sub-grid data sets, each of said sub-grid data sets containing a predetermined number of unknown grid impedance parameters and means for recursively modeling each of said sub-grid data sets into Markov processes. Such a system and method is taught by the present invention.

BRIEF DESCRIPTION OF THE DRAWINGS

Reference may now be had to the accompanying figures in which:

FIG. 2 is a graph showing Convergence characteristics according to the present invention;

FIG. 3 is a graph showing gross measurement error rejection according to the present invention;

FIG. 4 is a graph showing Branch susceptance tracking according to the present invention; and FIG. 5 is a graph showing Branch conductance according to the present invention.

DETAILED DESCRIPTION OF THE PREFERRED EMBODIMENT

BRIEF OVERVIEW

THE PROBLEM

Figure 1:
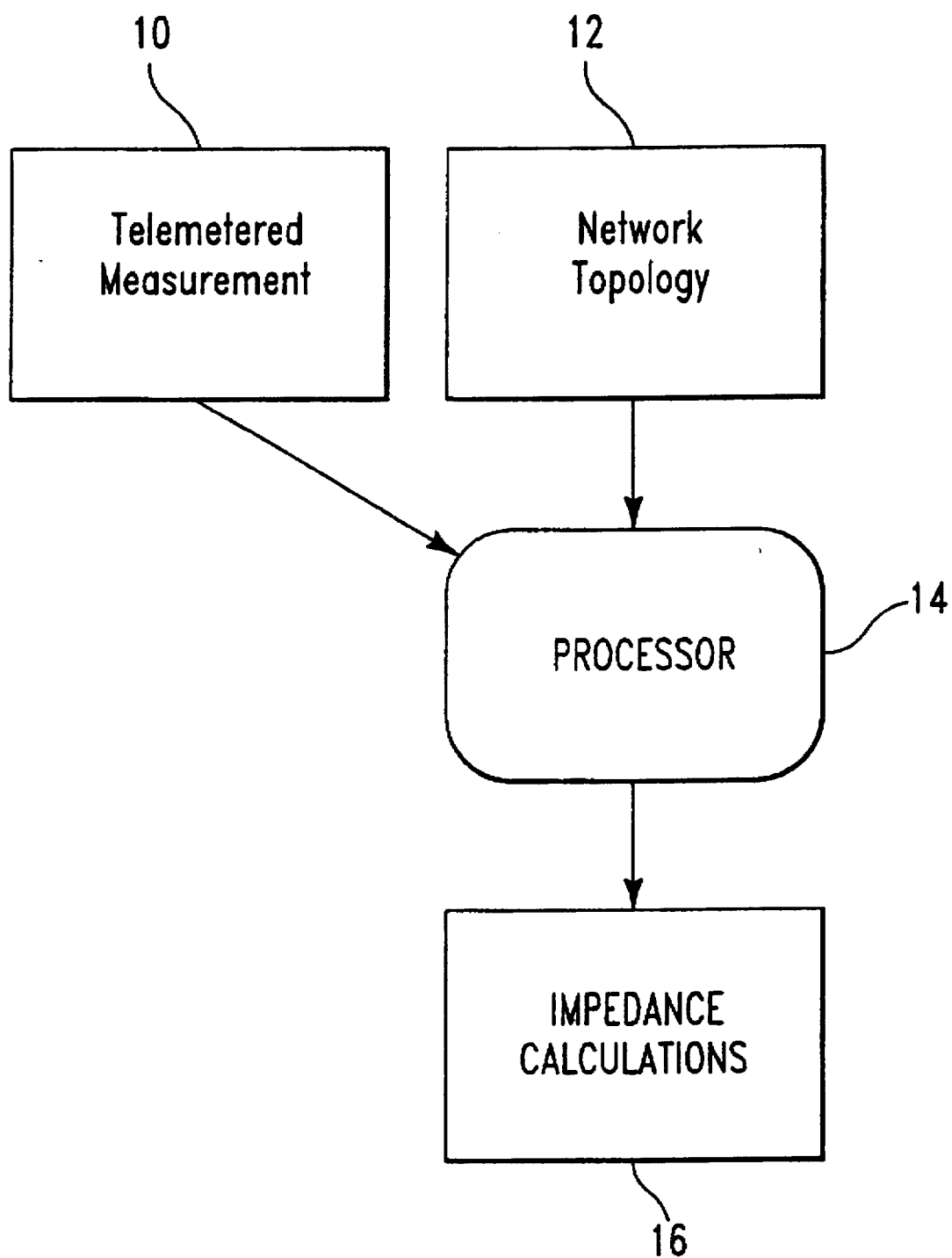
FIG. 1 is a block diagram showing the SCADA interconnection to an exemplary grid system as well as representative hardware according to the present invention.

Prior to a detailed description of the present invention, it is submitted that a general overview of the underlying problem and the inventive solution therefor is appropriate. Accordingly, after acquiring the appropriate data and general system information, it has been found that a recursive approach based on Kalman filters should be utilized. This approach first localizes the problem into several small observable subnetworks containing the unknown parameters or states and secondly, allows the parameters to be modeled as Markov processes thereby allowing estimation of time varying parameters.

As an advantageous by-product of this approach, bad measurement data is automatically identified which may then be rejected. Therefore reliable estimation of network parameters may be made even in the presence of spurious or bad measurement data.

We have found that deriving the discrete time state equations of an electric power system by use of the continuous time dynamics of the system and a stochastic model for loads, would dictate the use of a very complex model and would simply not be suitable for on-line parameter estimation. In view of this, we have found that by treating the bus voltage magnitudes and angles as purely uncorrelated in time, that is $X(t_i+1)$ does not depend on $X(t_i)$ the problem is greatly simplified while remaining satisfactorily accurate. Therefore, the model for the time evolution of X is that it is a discrete time white noise random process obeying the difference equation:

$$X(t_i+1)=X(t_i)+\omega(t_i)$$

where $\omega(t_i)$ is discrete time gaussian white noise.

We have also found that the network parameters, on the other hand, have a strong temporal dependence. We therefore model the unknown network parameters as a Markov process according to:

$$P(t_i+1)=P(t_i)+v(t_i)$$

where $v(t_i)$ is discrete time gaussian white noise.

Further, we have is assumed that the probability density function of the apriori parameter estimate errors at time $t_i$, $f[P(t_i)]$ and the probability density function of the state variables $f[X(t_i)]$ are gaussian. It is further assumed that the probability density function of the measurement errors at time ti is also gaussian with zero mean so that $$f[\epsilon(t_i)] = \frac{1}{\sqrt{(2\Pi)^m |R|}} e^{-\frac{1}{2} \epsilon(t_i)^t R^{-1} \epsilon(t_i)}$$

Since $\epsilon(t_i)=Z(t_i)-h[X(t_i),p(t_i)]$, the conditional probability density function of $Z(t_i)$ given $X(t_i)$ and $p(t_i)$ is $$f[z(t_i)|x(t_i),p(t_i)] = \frac{1}{\sqrt{(2\Pi)^m |R|}} e^{-\frac{1}{2} v(t_i)^t R^{-1} v(t_i)}$$

where $$v(t_i)=z(t_i)-h[x(t_i),p(t_i)]$$

Thereafter, by using Bayesian Estimation techniques, we have found that the joint conditional probability density function of the parameters and states conditioned on the measurements is proportional to the product of the two density functions, thus $$f[x(t_i),p(t_i)|z(t_i) \ldots z(t_i)]=f[z(t_i)|x(t_i),p(t_i)]f[p(t_i)]f[x(t_i)]$$

Accordingly, we have found that parameter estimation if based on computing a maximum likelihood estimate for the parameters using the above conditional probability expressions provides the ability to accurate and quickly estimate on-line and off line parameters.

PARAMETER ESTIMATION

The maximum likelihood estimate corresponds to finding the maximum of the conditional probability density function. Since the function is gaussian, this is equivalent to finding the minimum of the exponent of the gaussian function which may be written as:

$$\phi[y(t_i)] = \frac{1}{2} \{z(t_i) - h[x(t_i), p(t_i)]\}^T R^{-1} \{z(t_i) - h[x(t_i), p(t_i)]\} +$$

$$\frac{1}{2} [\bar{y}(t_i) - y(t_i)]^T \bar{Q}[y(t_i) - \bar{y}(t_i)]$$

where $$y^T(t_i) = [x^T(t_i), p^T(t_i)]$$

the necessary condition for a minimum is that the partial derivatives of the above function be zero, and thus we seek y(ti) to satisfy $$\frac{\partial \phi[y(t_i)]}{\partial y(t_i)} = -H[y(t_i)]^T R^{-1} \{z(t_i) - h[y(t_i)]\} + \bar{Q}(t_i)[y(t_i) - \bar{y}(t_i)] = 0$$

where $$H[y(t_i)] = \frac{\partial h[y(t_i)]}{\partial y(t_i)}$$

The $\bar{Q}(t_i)$ matrix is the inverse of the covariance matrix for $y(t_i)$. Accordingly, for the Markov models described above for the parameter and state variables $$\bar{Q}(t_i) = \begin{bmatrix} \bar{Q}_x(t_i) & 0 \\ 0 & \bar{Q}_p(t_i) \end{bmatrix}$$

The nonlinear necessary conditions are solved by Newton's method which are readily known to one skilled in the art. Application of this method results in the following iterative equations for the solution (Equation set 1):

$$C \Delta y(t_i) = H[y(t_i)^k]^T R^{-1} \{z(t_i) - h[y(t_i)^k]\} - \bar{Q}(t_i)[y(t_i)^k - \bar{y}(t_i)] b(t_i)^{k+1} =$$
$$y(t_i)^k + \Delta y(t_i)$$

where (equation set 2)

$$C = H[y(t_i)^k]^T R^{-1} H[y(t_i)^k] + \bar{Q}(t_i) + W[y(t_i)^k]$$

$$W[y(t_i)^k] = \left\{ -\sum_{j}^{m} \gamma_j[y(t_i)] \frac{\partial^2 h_j[y(t_i)]}{\partial y(t_i)^2} \right\} b(t_i) = y(t_i)^k$$

and (equation set 3)

$$\gamma_j[y(t_i)] = \{z_j(t_i) - h_j[y(t_i)]\}/R_{jj}$$

with j being a parameter index and m number of parameters.

These iterative linear equations we have called the Newton measurement update equations. They are solved at each iteration by triangular factorization of the C matrix. Because the subnetworks used for parameter estimation are small, there is no need to exploit sparsity in the C matrix.

Further, by using non-linear measurement functions, the a-posteriori density functions for the parameters and states are no longer gaussian. A gaussian approximation is then made to this density function and the standard Kalman filter time update equations are used to get the a-priori means and covariance matrices which are to be used in processing the subsequent measurement scan.

IMPLEMENTATION: ON-LINE & ADAPTIVE PARAMETER ESTIMATION

Referring now to FIG. 1 there is shown a block diagram which is representative of SCADA interconnection to a grid system along with hardware to calculate grid impedance according to the present invention. It is to be understood, that although in-the preferred embodiment of the present invention a power system grid is referred to, the present invention may be practiced with other types or smaller sizes such as, for example, a substation or group of substations without departing from the spirit and scope of the present invention.

Accordingly, a state estimator 14 collects and collates information/data from telemetered measurements 10, an understanding of the network topology 12. This data is collected by the Processor 14 which in the preferred embodiment of the present invention is incorporated into a computer (not shown). The output of Processor 14 thereafter produces Impedance Calculations 16 which may be studied or acted upon according to the particular user. In the preferred embodiment of the present invention, the Telemetered Measurements 10 are those types of measurements normally found in grid systems, such as those gathered from an RTU and therefore only a brief description will be had. More particularly, such information will contain various load information such as voltage, current, system loading, tap positions, and the like. Similarly, Network Topology 12 information will contain information, much of which is set and unchanging by the system such as equipment and line capacities, known/expected losses, efficiencies, and the like.

Additionally, as is readily apparent, the present invention can be used in both off-line and on-line modes. As a result of the recursive approach of the present invention, off-line execution requires accumulation, storage and management of many measurement snapshots for subsequent use and extrapolation of impedance parameters.

However, in the on-line mode, in the preferred embodiment of the present invention, the method is incorporated into the Real Time Sequence (RTS) of network analysis applications of Energy Management Systems (EMS). As other RTS functions, in the preferred embodiment of the present invention, the real time parameter estimator executes periodically, with the periodicity selected by the user. Therefore, as is evident from FIG. 1, the parameter estimator receives a current snapshot of SCADA telemetry, retrieves the latest estimates of branch parameters, and performs the recursive estimation processing. Therefore, the results of parameter estimation—improved values of branch parameters are immediately available to users and can be fed back into the data base, replacing old parameter values for an immediate use in other network applications.

As is readily evident, on-line parameter estimation has substantial advantages over the off-line execution. Further, the present invention has a permanent nature in that it has the ability to continuously monitor and refine branch parameters without user intervention. This therefore provides instant availability of current parameter values for users as well as other applications. Moreover, unlike conventional systems which are forced to use off-line parameter estimation to get truly accurate impedance values, the present invention does not require a special software infrastructure to accumulate, store and manage measurement snapshots.

Further, due to the continuous nature of the present invention, on-line parameter estimation facilitates impedance parameter tracking as some parameter values fluctuate over time. It has been found that this is particularly important and advantageous when system values change as a result of weather resulting from, for example, temperature swings, humidity, the presence of snow on a transmission line and the like.

Further, it has been found that by breaking the power network into small subnetworks, according to readily known and available techniques and as described more fully below, the impedance of the system can be calculated much more quickly and accurately. This is particularly so when one considers the recursive approach contemplated since so may more iterations can be done in the same period of time that the calculations for an complete network would require. Accordingly, by breaking the network into such smaller subnetworks and performing calculations according to Equation sets 1, 2 and 3 described above the solution becomes solvable much more accurately and quickly.

In the preferred embodiment of the present invention, each subnetwork, referred to as the local subsystem, is a small portion of the network consisting of a few branches with sufficient number of measurements to ensure observability. Subsystems are formed by an outward expansion from a root bus. The expansion is terminated as soon as the observability is established. Accordingly, it is clear that poorly telemetered branches may not be included in any subsystem and are not estimated initially. Subsystems are reconstructed in every on-line execution to reflect changes in network and measurement topology. In the process, subsystems may appear and disappear, acquire or lose branches.

Over time, branches across many measurement samples and for variety of loading conditions which exhibit little change in estimates of their parameters are granted the designation of reliable branches. Reliable branches are the ones whose impedance parameters have been established and can be used as known quantities in expanded or newly created subsystems that include previously unobservable branches. In this fashion, reliable branches allow an extension of parameter estimation to branches with insufficient measurement redundancy. In time, these newly estimated branch may earn the designation of "reliable branches" as well. They, in turn, are used to facilitate an estimation of other insufficiently metered branches thus increasing the number of branches subject to the parameter estimation. As a result, the forest of estimated branches "grows" over time.

Therefore, the present invention is implementable as an adaptive parameter estimator, starting by estimating only a few, highly telemetered branches. As impedance parameters of those branches become established, they are used to extend the parameter estimation to less metered branches and so on. The solution will ultimately include all network branches with adequate telemetry excluding only those for which a reliable parameter estimation can not be performed.

However, it should be remembered that although all reliable branches are continued to be monitored, the status of a "reliable branch" can be revoked at any time, should branch parameters exhibit an unreliable behavior.

One of the key capabilities inherent in the present invention, particularly in light of the adaptive nature mentioned above, is the ability to identify and reject gross measurement errors. In this regard, there are a number of modern identification methods which can be used and are readily known and available to one skilled in the art. Further, the small size of subnetworks and ensuing matrices makes the application of robust bad data processing easily done thereby providing a highly reliable impedance estimation for the system or subsystem.

TEST RESULTS

The proposed invention has been extensively tested on a 100-bus network having 185 branches which is considered exemplary. However, it is to be understood the that number of busses, branches, measurement devices and the like maybe increased or decreased without departing from the spirit and scope of the present invention. The measurement set consisted of 170 power measurements, 4 ampere magnitude, 114 voltage magnitude, and 21 tap position measurements. Noisy measurement samples were generated for a variety of loading, interchange and topological condition by a Real Time Sequence Simulator (RTSST). In this regard branch impedance parameters as follows were viewed: transfer susceptance (B12); transfer conductance (G12); charging (B11, B22) and corona losses (G11, G22).

The convergence characteristics of the present invention were analyzed in detail. FIG. 2 shows a typical pattern of continuous refinement of branch impedance parameters over the sample space as a result of recursive estimation according to the present invention. Here it can be seen that initial large errors in all parameters of a branch are now reduced to small values.

Referring now to FIG. 3, the present inventions ability to identify and reject bad data in measurements can be seen. Here it can be seen that a rejection of gross measurement error in sample 15 speeds up the convergence and improves the accuracy of parameter estimation. Accordingly, even if the error were to go undetected, the eventual correct estimation of parameters is nevertheless achieved, due to the absence of gross errors in subsequent samples.

The present inventions ability to track changes in branch parameters was subject of another series of tests. This set of tests concluded that contrary to industry beliefs, branch parameters are not constant. Parameters may change seasonally, for instance, as a result of changes in line clearance due to ice buildup and accumulation of snow in winter and vegetation growth in summer. Parameter values can also be affected by sharp changes in ambient conditions. Line conductance may even fluctuate on an hourly basis following changes in line loading and the resultant changes in conductor temperature.

Referring now to FIGS. 4 and 5, parameter tracking according to the present invention was tested on measurement samples generated for different values of branch parameters. In this regard, a comprehensive test of the accuracy of the present invention was conducted by introducing program generated random errors between −100% and +100% in all parameters of 37 branches of the 100-bus network and executing parameter estimation on 100 measurement samples. Accordingly, FIGS. 4 and 5 show how accurate estimates of parameters were obtained for all contaminated branches. Further, representative results for 10 branches are summarized in Table 1 found below.

TABLE 1

PARAMETER ESTIMATION TEST RESULTS

| Line | Para-meter | Parameter Value | | | Parameter Error (%) | |
|---|---|---|---|---|---|---|
| | | Actual | Data Base | Esti-mated | Actual | Esti-mated |
| 1 | B11 | 0.019 | 0.015 | 0.019 | −22.1 | 1.0 |
|   | B12 | −8.138 | −2.884 | −8.154 | −64.6 | 0.2 |
|   | G12 | 1.326 | 1.624 | 1.329 | 22.5 | 0.2 |
| 2 | B11 | 0.051 | 0.062 | 0.051 | 19.8 | −0.8 |
|   | B12 | −23.204 | −9.393 | −23.188 | −59.5 | −0.1 |
|   | G12 | 2.506 | 2.019 | 2.507 | −19.4 | 0.1 |
| 3 | B11 | 0.063 | 0.082 | 0.063 | 30.8 | 0.5 |
|   | B12 | −18.975 | −9.490 | −19.023 | −50.0 | 0.3 |
|   | G12 | 2.040 | 0.672 | 2.031 | −67.1 | −0.4 |
| 4 | B11 | 0.064 | 0.110 | 0.064 | 72.8 | 1.3 |
|   | B12 | −16.122 | −1.900 | −16.081 | −88.2 | −0.3 |
|   | G12 | 1.628 | 2.420 | 1.648 | 48.7 | 1.3 |
| 5 | B11 | 0.030 | 0.036 | 0.030 | 19.9 | 0.3 |
|   | B12 | −40.201 | −21.504 | −40.161 | −46.5 | −0.1 |
|   | G12 | 4.249 | 2.622 | 4.276 | −38.3 | 0.6 |
| 6 | B11 | 0.004 | 0.005 | 0.004 | 19.8 | 2.5 |
|   | B12 | −260.27 | −257.37 | −260.48 | −1.1 | 0.1 |
|   | G12 | 27.397 | 34.812 | 27.782 | 27.1 | 1.4 |
| 7 | B11 | 0.042 | 0.052 | 0.042 | 23.3 | −1.0 |

TABLE 1-continued

PARAMETER ESTIMATION TEST RESULTS

| Line | Para-meter | Parameter Value | | | Parameter Error (%) | |
|---|---|---|---|---|---|---|
| | | Actual | Data Base | Esti-mated | Actual | Esti-mated |
| | B12 | −42.901 | −20.582 | −42.920 | −52.0 | 0.0 |
| | G12 | 4.086 | 0.925 | 4.099 | −77.4 | 0.3 |
| 8 | B11 | 0.052 | 0.009 | 0.051 | −82.1 | −1.3 |
| | B12 | −2.369 | −0.612 | −2.370 | −74.2 | 0.0 |
| | G12 | 0.574 | 0.010 | 0.573 | −98.2 | −0.2 |
| 9 | B11 | 0.065 | 0.111 | 0.065 | 72.3 | 0.2 |
| | B12 | −14.838 | −16.233 | −14.818 | 9.3 | −0.1 |
| | G12 | 2.158 | 0.140 | 2.173 | −93.5 | 0.7 |
| 10 | B11 | 0.011 | 0.018 | 0.011 | 53.3 | −0.4 |
| | B12 | −12.925 | −14.439 | −13.016 | 53.3 | −0.4 |
| | G12 | 2.347 | 4.117 | 2.307 | 75.4 | −1.7 |

Further, the present invention was tested in an off-line mode in an energy management system of an exemplary 1632-bus for a utility. In this regard, 168 measurement snapshots were accumulated on a one hour basis over a 7-day period and used to estimate the parameters of 99 transmission lines. The results of parameter estimation indicated the presence of sizable errors or deviation from the data base values of parameters for the tested branches. These error statistics are summarized in Table 2 below. This parameter estimation demonstrated fast execution requiring only 0.94 sec to estimate parameters of 99 branches in each solution cycle on the IBM RS/6000 model 530 workstation.

TABLE 2

ERRORS IN BRANCH PARAMETERS OF 1632-BUS NETWORK

| Range of changes in data base parameter values (%) | Percentage of branches with parameter changes within range | | |
|---|---|---|---|
| | B11 | B12 | G12 |
| 0–10 | 22.2 | 52.5 | 65.7 |
| 10–30 | 21.2 | 28.3 | 14.1 |
| 30–50 | 12.1 | 9.1 | 10.1 |
| 50–100 | 10.1 | 8.1 | 7.1 |
| 100–200 | 10.1 | 2.0 | 3.0 |
| 200–500 | 7.1 | | |
| 500–1000 | 12.1 | | |
| 1000–4000 | 5.1 | | |

Accordingly, it can be seen that the estimation of errors in impedance parameters of network is of paramount importance in energy management systems. Undetected errors in data base parameter values may grossly distort the results of state estimation, optimization and security functions, rendering them useless. We have discovered that these problems can be solved by utilizing a recursive maximum likelihood estimation and a Kalman filter to accurately obtain estimates of branch parameters by continuously refining parameter values over many measurement samples.

Further, the present invention utilizes available measurement redundancy by first estimating parameters of well metered branches and then adaptively expands the solution scope to include less metered branches.

It is to be understood that many variations of the present invention may be practiced without departing from the spirit and scope of the present invention and that the present invention be limited only by the claims appended hereto.

What is claimed is:

1. An energy management system for recursive parameter energy management control, comprising:

control means for changing the settings of a power grid or subsystem (grid);

measurement means for measuring the status and settings of said (grid) and producing representative grid data thereof;

a computer having memory means for storing said grid data and further having a program means for analyzing said grid data and producing values representative of the impedance parameters of said grid, said program means including means for separating said grid data into a plurality of sub-grid data sets, each of said sub-grid data sets containing a predetermined number of unknown grid impedance parameters and means for recursively modeling each of said sub-grid data sets into Markov processes; and comparing the impedance parameters of said grid which were derived from Markov processes recursively modeling said sub-grid data sets a predetermined grid impedance parameters.

2. An energy management system according to claim 1 wherein said control means changes said settings of said grid in response to said comparison of said derived impedance parameters with said predetermined grid impedance parameters.

3. An energy management system according to claim 1 wherein said grid data is comprised of at least voltage magnitudes and angles and wherein said program means treats said voltage magnitudes and angles as noncorrelated in time where $X(t_i+1)$ does not depend on $X(t_i)$.

4. An energy management system according to claim 3 wherein the model for X is such that it is a discrete time white noise random process obeying the difference equation:

$$X(t_i+1) = X(t_i) + \omega(t_i)$$

where $\omega(t_i)$ is discrete time gaussian white noise.

5. An energy management system according to claim 1 wherein unknown grid impedance parameters are modeled to said Markov processes according to:

$$P(t_i+1) = P(t_i) + v(t_i)$$

where v(ti) is discrete time gaussian white noise.

\* \* \* \* \*